(12) United States Patent
Matsumoto

(10) Patent No.: US 10,738,377 B2
(45) Date of Patent: Aug. 11, 2020

(54) METHOD FOR MANUFACTURING GRAPHENE AND APPARATUS FOR MANUFACTURING GRAPHENE

(71) Applicant: TOKYO ELECTRON LIMITED, Tokyo (JP)

(72) Inventor: Takashi Matsumoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/910,301

(22) Filed: Mar. 2, 2018

(65) Prior Publication Data

US 2018/0187298 A1 Jul. 5, 2018

Related U.S. Application Data

(63) Continuation of application No. PCT/JP2016/074722, filed on Aug. 18, 2016.

(30) Foreign Application Priority Data

Sep. 2, 2015 (JP) .................................. 2015-173086

(51) Int. Cl.
*B05D 3/06* (2006.01)
*C23C 14/22* (2006.01)
(Continued)

(52) U.S. Cl.
CPC .......... *C23C 14/221* (2013.01); *C23C 14/024* (2013.01); *C23C 14/0605* (2013.01);
(Continued)

(58) Field of Classification Search
CPC . C23C 14/024; C23C 14/0605; C23C 14/221; C23C 14/48; C23C 14/5833;
(Continued)

(56) References Cited

U.S. PATENT DOCUMENTS 5,398,641 A * 3/1995 Shih .................... H01L 21/0256
117/101
8,163,355 B2 * 4/2012 Sandhu .................... C23C 16/26
250/492.21
(Continued)

FOREIGN PATENT DOCUMENTS

JP 7-312190 A * 11/1995 ............. H01J 37/08
JP 2004277201 A 10/2004
(Continued)

OTHER PUBLICATIONS

A.V. Talyzin et al.; "Coronene Fusion by Heat Treatment: Road to Nanographenes"; The Journal of Physical Chemistry C; May 16, 2011; vol. 115; pp. 13207-13214.*
(Continued)

*Primary Examiner* — Marianne L Padgett
(74) *Attorney, Agent, or Firm* — Nath, Goldberg & Meyer; Jerald L. Meyer

(57) ABSTRACT

There is provided a method for manufacturing graphene. The method includes an adsorption step of causing six-membered ring structures of carbon atoms to be adsorbed to a surface of a substrate; and an irradiation step of irradiating the surface of the substrate with a beam of a molecule containing carbon atoms.

9 Claims, 7 Drawing Sheets

(51) Int. Cl.
  *C23C 16/26* (2006.01)
  *C23C 16/452* (2006.01)
  *C23C 16/48* (2006.01)
  *C23C 14/02* (2006.01)
  *C23C 18/14* (2006.01)
  *C23C 14/58* (2006.01)
  *C23C 14/06* (2006.01)

(52) U.S. Cl.
  CPC .......... *C23C 14/5833* (2013.01); *C23C 16/26* (2013.01); *C23C 16/452* (2013.01); *C23C 16/486* (2013.01); *C23C 18/14* (2013.01)

(58) Field of Classification Search
  CPC ... C23C 16/0272; C23C 16/26; C23C 16/452; C23C 16/4552; C23C 16/45527; C23C 16/486; C23C 18/14
  USPC ............ 427/525, 533, 551, 552, 595, 249.1; 117/87, 95, 103, 104, 108; 423/445 R, 423/448, 460, 445 B
  See application file for complete search history.

(56) References Cited

U.S. PATENT DOCUMENTS

| | | | | |
|---|---|---|---|---|
| 8,808,810 | B2* | 8/2014 | Veerasamy | B82Y 30/00 427/508 |
| 9,822,009 | B2* | 11/2017 | Kagaya | C23C 16/0281 |
| 10,535,880 | B2* | 1/2020 | Zhamu | H01M 6/02 |
| 10,535,892 | B2* | 1/2020 | Zhamu | H01M 10/0565 |
| 2009/0214800 | A1* | 8/2009 | Saito | B01J 19/088 427/577 |
| 2011/0033688 | A1 | 2/2011 | Veerasamy | |
| 2011/0091647 | A1 | 4/2011 | Colombo et al. | |
| 2011/0143045 | A1* | 6/2011 | Veerasamy | B82Y 30/00 427/495 |
| 2012/0021249 | A1 | 1/2012 | Shin et al. | |
| 2012/0021250 | A1* | 1/2012 | Lee | B82Y 30/00 428/688 |
| 2012/0141799 | A1* | 6/2012 | Kub | B82Y 30/00 428/408 |
| 2012/0205030 | A1* | 8/2012 | Kiuchi | C09J 7/29 156/85 |
| 2012/0261644 | A1* | 10/2012 | Dimitrakopoulos | B82Y 40/00 257/29 |
| 2013/0001515 | A1* | 1/2013 | Li | H01L 21/0242 257/24 |
| 2014/0272195 | A1* | 9/2014 | McAlister | C23C 16/48 427/585 |
| 2014/0287155 | A1* | 9/2014 | Matsumoto | B01J 23/75 427/535 |
| 2014/0363363 | A1* | 12/2014 | Naritsuka | B01J 37/08 423/448 |
| 2014/0374960 | A1* | 12/2014 | Cojocaru | C01B 32/184 264/430 |
| 2015/0013593 | A1* | 1/2015 | Dong | H01L 21/02433 117/88 |
| 2015/0062028 | A1* | 3/2015 | Go | G06F 1/1616 345/173 |
| 2015/0235847 | A1* | 8/2015 | Beasley | H01L 21/0237 427/535 |
| 2016/0017484 | A1* | 1/2016 | Kikuchi | C23C 16/452 427/569 |
| 2016/0068397 | A1* | 3/2016 | Su | H01J 37/3277 427/577 |
| 2017/0029942 | A1* | 2/2017 | Matsumoto | B01J 23/75 |
| 2018/0057933 | A1* | 3/2018 | Ifuku | C01B 32/186 |
| 2020/0026382 | A1* | 1/2020 | Zhang | H05K 1/0393 |

FOREIGN PATENT DOCUMENTS

| | | |
|---|---|---|
| JP | 2010212619 A | 9/2010 |
| JP | 201314484 A | 1/2013 |
| JP | 2013014484 A | 1/2013 |
| JP | 201534102 A | 2/2015 |
| JP | 2015034102 A | 2/2015 |

OTHER PUBLICATIONS

Ning Zhan et al.; "Cobalt-assisted large-area epitaxial graphene growth in thermal cracker enhanced gas source molecular beam epitaxy"; Applied Physics A, Materials Science & processing, Rapid Communications; vol. 105; pp. 341-345; Sep. 28, 2011.*
International Search Report dated Aug. 26, 2014 corresponding to application No. PCT/JP2014/064564.
Naeemi, Azad, et al."Conductance Modeling for Graphene Nanoribbon (GNR) Interconnects" IEEE Electron Device Letters, vol. 28. No. 5; May 2007.
Yamazaki, Yuichi, et al."Low-Temperature Graphene Growth Originating at Crystalline Facets of Catalytic Metal" Applied Physics Express 5 (2012); 025101, pp. 025101-1 to 025101-3.
International Search Report dated Nov. 1, 2016 corresponding to application No. PCT/JP2016/074722.

* cited by examiner

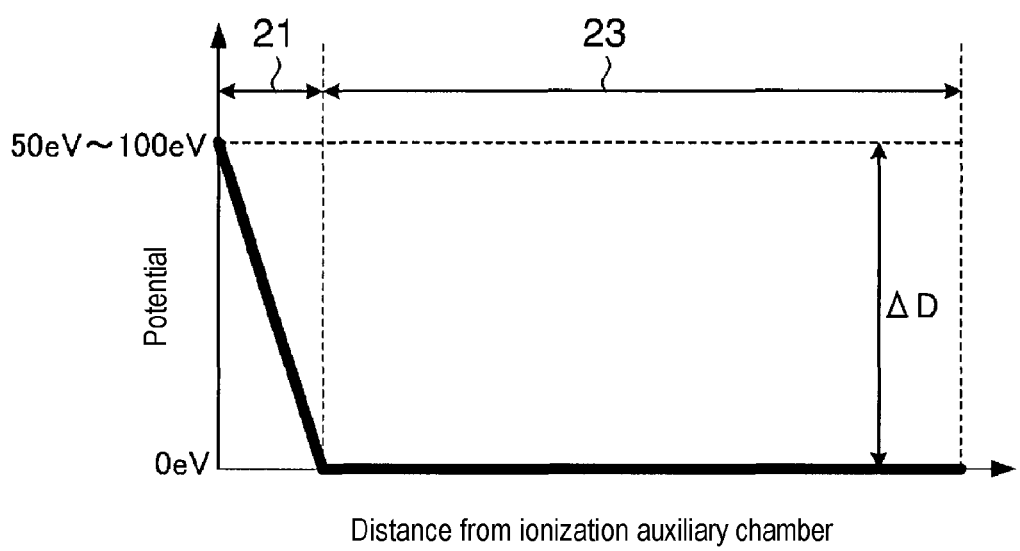

METHOD FOR MANUFACTURING GRAPHENE AND APPARATUS FOR MANUFACTURING GRAPHENE

CROSS-REFERENCE TO RELATED APPLICATION

This application is a bypass continuation application of international application No. PCT/JP2016/074722 having an international filing date of Aug. 18, 2016 and designating the United States, the international application being based upon and claiming the benefit of priority from Japanese Patent Application No. 2015-173086, filed on Sep. 2, 2015, the entire contents of which are incorporated herein by reference.

TECHNICAL FIELD

The present disclosure relates to a method for manufacturing graphene, an apparatus for manufacturing graphene, and a method for manufacturing an electronic device.

BACKGROUND

Graphene, which is an aggregate of six-membered ring structures of carbon atoms, has much higher mobility than silicon (Si), for example, mobility of 2,000,000 $cm^2$/Vs in theoretical value, and mobility of 200,000 $cm^2$/Vs in past experimental value. Thus, application of graphene to semiconductor devices, for example, ultrahigh-speed switching devices and high-frequency devices has been studied. In addition, graphene also has a ballistic conduction characteristic. Thus, there have been studies contemplating the use of graphene as a fine-width low-resistance wiring material instead of copper (Cu) in a semiconductor device.

As a method for manufacturing graphene, a method has been used in which a film formation target such as copper or the like is heated to a high temperature, for example, 800 degrees C. or higher. In this method, a carbon source gas is brought into contact with the film formation target and decomposed, and graphene is generated on the surface of the film formation target by the catalytic activity of the film formation target. The graphene manufactured by this manufacturing method is high in quality. However, in order to apply the graphene to an electronic device, it is necessary to separate the graphene from the film formation target and to transfer the graphene to a silicon substrate. Since graphene is a single layered graphite and is very thin, it is difficult to separate the graphene from a large-area silicon substrate or to transfer the graphene to a large-area substrate. Further, in the case of directly manufacturing graphene on a silicon substrate, when heated at a high temperature of 800 degrees C. or higher, elements of an electronic device formed before graphene generation may be destroyed by high temperature heating during the generation of graphene.

Under the foregoing circumstances, a method for manufacturing graphene on a silicon substrate at a relatively low temperature, for example, 500 to 600 degrees C. has been proposed. As such a method for manufacturing graphene at a low temperature, a method has been used of decomposing a raw material gas containing carbon atoms by plasma CVD, thermal CVD or laser irradiation to recrystallize carbon atoms on the surface of a silicon substrate. For example, a method has been used for manufacturing graphene on the surface of a silicon substrate by causing a raw material gas of a compound having carbon and hydrogen to flow on the silicon substrate and generating plasma from the raw material gas by microwave excitation while irradiating the silicon substrate with laser light.

However, in the case of decomposing a raw material gas by plasma or laser light, it is difficult to control the energy applied to each carbon atom because the distribution of energy applied to the carbon atoms decomposed from the raw material gas extends over a wide range. In this case, for example, diamond or DLC (Diamond-Like Carbon) instead of graphene may be generated from the carbon atoms to which excessively high energy is applied, and the carbon atoms to which energy is not sufficiently applied may not be completely recrystallized. Therefore, the graphene thus manufactured contains a carbon bond other than a six-membered ring structure of a carbon atom, and a part thereof becomes amorphous. That is, it is difficult to manufacture a high-quality graphene.

SUMMARY

The present disclosure provides some embodiments of a method for manufacturing graphene capable of manufacturing high quality graphene, an apparatus for manufacturing graphene and a method for manufacturing an electronic device.

According to one embodiment of the present disclosure, a method for manufacturing graphene includes: an adsorption step of causing six-membered ring structures of carbon atoms to be adsorbed to a surface of a substrate; and an irradiation step of irradiating the surface of the substrate with a beam of a molecule containing carbon atoms.

According to another embodiment of the present disclosure, a method for manufacturing graphene includes: an adsorption step of causing linear structures of carbon atoms to be adsorbed to a surface of a substrate; and an irradiation step of irradiating the surface of the substrate with a beam of a molecule containing carbon atoms, wherein the surface of the substrate has one-dimensional periodicity or two-dimensional periodicity.

According to a further embodiment of the present disclosure, an apparatus for manufacturing graphene includes: a gas supply unit configured to supply a gas of a molecule containing six-membered ring structures of carbon atoms toward a surface of a substrate; and a beam irradiation unit configured to irradiate the surface of the substrate with a beam of a molecule containing carbon atoms.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is an internal space potential diagram of an accommodating chamber shown in FIG. 1.

DETAILED DESCRIPTION

Embodiments of the present disclosure will now be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a first embodiment of the present disclosure will be described.

Figure 1:
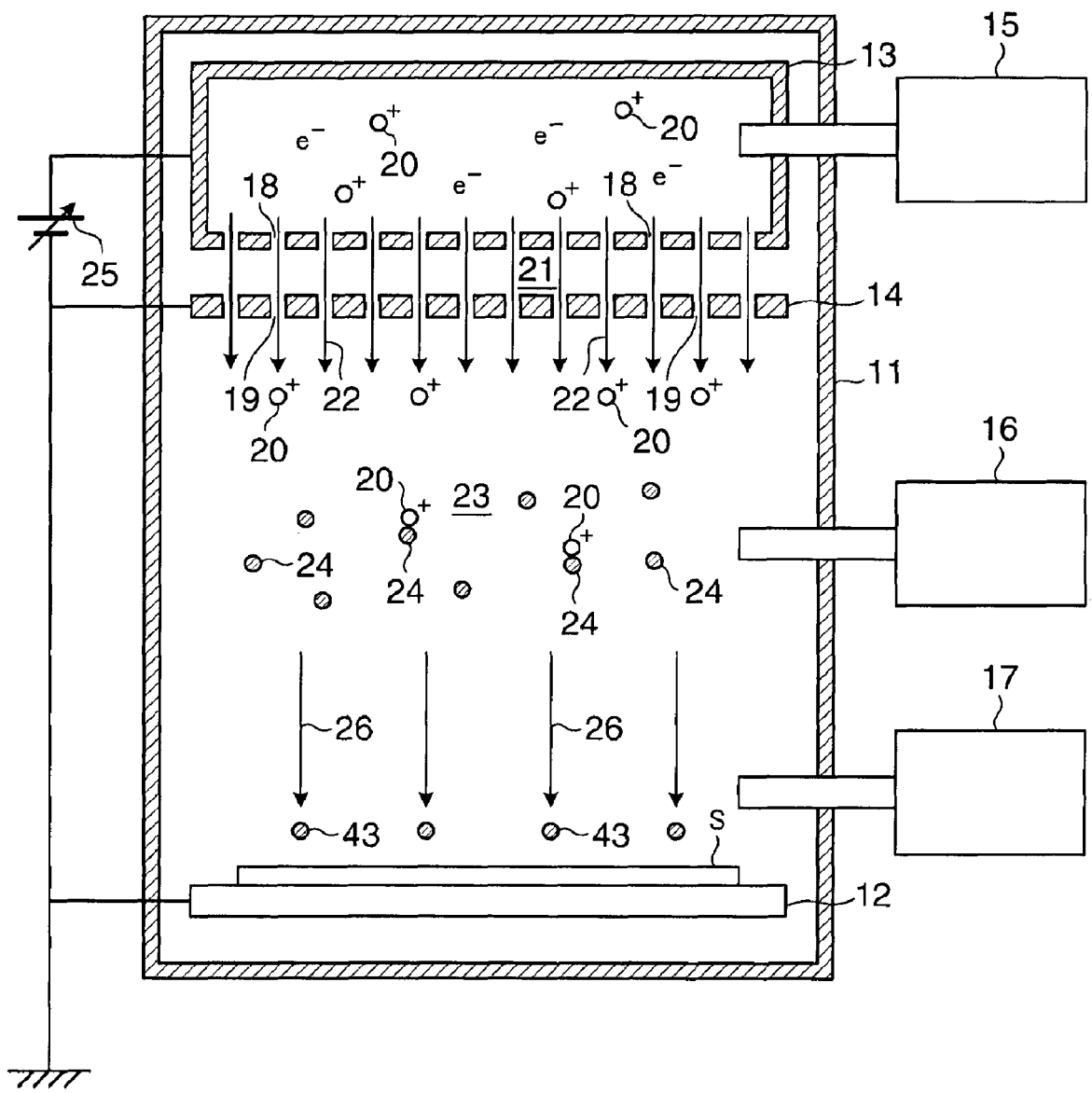
FIG. 1 is a sectional view schematically showing a configuration of an apparatus for manufacturing graphene according to a first embodiment of the present disclosure.

FIG. 1 is a sectional view schematically showing a configuration of an apparatus for manufacturing graphene according to a first embodiment of the present disclosure.

Referring to FIG. 1, an apparatus for manufacturing graphene 10 includes an accommodating chamber 11 configured to accommodate a substrate S on which elements of an electronic device are formed, a stage 12 disposed inside the accommodating chamber 11 and configured to hold the substrate S, an ionization auxiliary chamber 13 disposed inside the accommodating chamber 11 so as to face the stage 12, and a grounding plate 14 disposed between the ionization auxiliary chamber 13 and the stage 12 and configured to face the ionization auxiliary chamber 13.

The apparatus for manufacturing graphene 10 further includes a first gas supply device 15 configured to supply an ion generation gas to the interior of the ionization auxiliary chamber 13, a second gas supply device 16 (another gas supply unit) configured to supply a charge conversion gas (described later) into a space 23 between the grounding plate 14 and the stage 12, and a third gas supply device 17 (gas supply unit) configured to supply an adsorption gas toward the surface of the substrate S held by the stage 12.

The ionization auxiliary chamber 13 takes the form of a casing and includes an ion source (not shown) for ionizing an ion generation gas supplied to the interior thereof. As the ion source, an ECR (Electron Cyclotron Resonance) ion source, a Freeman type ion source, a bucket type ion source, an ICP (Inductive Coupled Plasma) ion source or a surface wave plasma ion source is used. In addition, the ionization auxiliary chamber 13 has a large number of ion passage holes 18 opened on a surface facing the grounding plate 14. Further, the grounding plate 14 has a large number of ion ejection holes 19 penetrating the grounding plate 14 in the thickness direction. Each of the ion ejection holes 19 is arranged on the same straight line as each of the ion passage holes 18.

In the apparatus for manufacturing graphene 10, the grounding plate 14 and the stage 12 are electrically grounded while a predetermined potential, for example, a positive potential of 50 V to 100 V is applied to the ionization auxiliary chamber 13 by a DC power supply 25. As a result, an electrostatic field 21 is formed between the ionization auxiliary chamber 13 and the grounding plate 14. Since the substrate S electrically conducts with the stage 12, the potential of the substrate S also becomes the ground potential. Further, when an ion generation gas containing carbon atoms, for example, a hydrocarbon gas, is supplied into the ionization auxiliary chamber 13, the ion generation gas is ionized by the ion source. Specifically, plasma is generated from the ion generation gas. The plasma contains electrons, hydrocarbon radicals and hydrocarbon cations 20. Further, the second gas supply device 16 supplies a charge conversion gas to the space 23 between the grounding plate 14 and the stage 12. The charge conversion gas is a molecule (predetermined molecule) containing a carbon atom double bond or a carbon atom triple bond, for example, a gas of acetylene 24.

FIG. 2 is a potential diagram of an internal space of the accommodating chamber shown in FIG. 1.

In FIG. 2, the vertical axis represents the potential of the internal space (including the electrostatic field 21 and the space 23) of the accommodating chamber 11 (hereinafter simply referred to as "space potential"), and the horizontal axis represents the distance along the direction from the ionization auxiliary chamber 13 to the stage 12 on the basis of the surface of the ionization auxiliary chamber 13 facing the grounding plate 14.

In the apparatus for manufacturing graphene 10, as described above, the potential of the ionization auxiliary chamber 13 is a positive potential of 50 V to 100 V, whereas the grounding plate 14 is grounded. Therefore, the space potential is sharply decreased from the ionization auxiliary chamber 13 toward the grounding plate 14 (see a thick line in the FIG. 2). As a result, the hydrocarbon cations 20 leaking from the respective ion passage holes 18 of the ionization auxiliary chamber 13 to the electrostatic field 21 are accelerated toward the grounding plate 14. The accelerated hydrocarbon cations 20 pass through the respective ion ejection holes 19 while maintaining an ionized state, and are ejected toward the space 23. The respective hydrocarbon cations 20 ejected toward the space 23 form an ion beam 22.

In addition, since the grounding plate 14 and the stage 12 are grounded, the space potential does not change in the space 23 (see a thick line in the FIG. 2). Therefore, the respective hydrocarbon cations 20 ejected into the space 23 go toward the substrate S held on the stage 12 without being decelerated. That is, the ion beam 22 is irradiated toward the substrate S.

Since the respective hydrocarbon cations 20 are accelerated in the electrostatic field 21, the energy corresponding to the potential difference $\Delta D$ of the electrostatic field 21 is imparted to the respective hydrocarbon cations 20 as kinetic energy. In the present embodiment, since the potential difference $\Delta D$ of the electrostatic field 21 is 50 V to 100 V, the kinetic energy of each of the hydrocarbon cations 20, i.e., the energy of the ion beam 22 is 50 eV to 100 eV. On the other hand, in the internal space of the accommodating chamber 11, there is no electric field for imparting kinetic energy to the respective hydrocarbon cations 20 besides the electrostatic field 21. Furthermore, there is no mechanism for imparting other energy such as thermal energy or the like to the respective hydrocarbon cations 2. Therefore, by merely controlling the potential difference $\Delta D$ of the electrostatic field 21, it is possible to control the kinetic energy of each of the hydrocarbon cations 20 and, consequently, the energy of the ion beam 22. In this regard, since the potential difference $\Delta D$ of the electrostatic field 21 is determined only by the voltage applied by the DC power supply 25, the potential difference $\Delta D$ can be easily and accurately controlled. Accordingly, the energy of the ion beam 22 can be easily and accurately controlled.

Returning to FIG. 1, when the ion beam 22 passes through the space 23, the respective hydrocarbon cations 20 collide with the acetylene 24. The charge conversion gas supplied to the space 23 is not limited to the acetylene 24 and may be a hydrocarbon gas containing a carbon atom double bond or a carbon atom triple bond as described above. For example, the charge conversion gas may be the same hydrocarbon gas as the hydrocarbon gas as the ion generation gas supplied to the interior of the ionization auxiliary chamber 13. At this time, the positive charge of each of the hydrocarbon cations 20 moves to the acetylene 24 (charge conversion), and the hydrocarbon cations 20 after collision with the acetylene 24 become electrically neutral hydrocarbon molecules 43. Since the kinetic energy of each of the hydrocarbon cations 20 is not imparted to the acetylene 24 in the charge conversion, the movement vector of each of the hydrocarbon molecules 43 is the same as the movement vector of each of the hydrocarbon cations 20, and each of hydrocarbon molecules 43 moves toward the substrate S. As a result, a molecular beam 26 composed of the electrically neutral hydrocarbon molecules 43 is formed in the space 23 between the grounding plate 14 and the substrate S and is irradiated toward the substrate S. On the other hand, since the acetylene 24 that has received a positive charge from each of the hydrocarbon cations 20 has only a small kinetic energy, for example, kinetic energy of about 0.01 eV, the acetylene 24 drifts in the space 23 even after the charge conversion without moving toward the substrate S and collides with the inner wall of the accommodating chamber 11. Thus, the acetylene 24 is deactivated. The deactivated acetylene 24 is discharged to the outside of the accommodating chamber 11 by, for example, an exhaust device (not shown).

As described above, since the kinetic energy of each of the hydrocarbon cations 20 is not imparted to the acetylene 24, each of the hydrocarbon molecules 43 has the same kinetic energy as each of the hydrocarbon cations 20. Therefore, the energy of the molecular beam 26 is also 50 eV to 100 eV which is the same as the energy of the ion beam 22. That is, the energy of the molecular beam 26 depends on the energy of the ion beam 22. Therefore, by controlling the potential difference ΔD of the electrostatic field 21, it is possible to easily and accurately control the energy of the molecular beam 26 in an indirect manner. In the present embodiment, the ionization auxiliary chamber 13, the grounding plate 14 and the second gas supply device 16 constitute a beam irradiation unit, and the ionization auxiliary chamber 13 and the grounding plate 14 constitute an acceleration unit.

The third gas supply device 17 supplies an adsorption gas, specifically, a molecular gas having six-membered ring structures of carbon atoms (hereinafter simply referred to as "six-membered ring structures"), toward the surface of the substrate S held by the stage 12. Each of the six-membered ring structures in each of the molecules of the adsorption gas supplied toward the substrate S is adsorbed to the surface of the substrate S. In the present embodiment, graphene is manufactured by using each of the six-membered ring structures adsorbed to the surface of the substrate S.

Figure 3A:
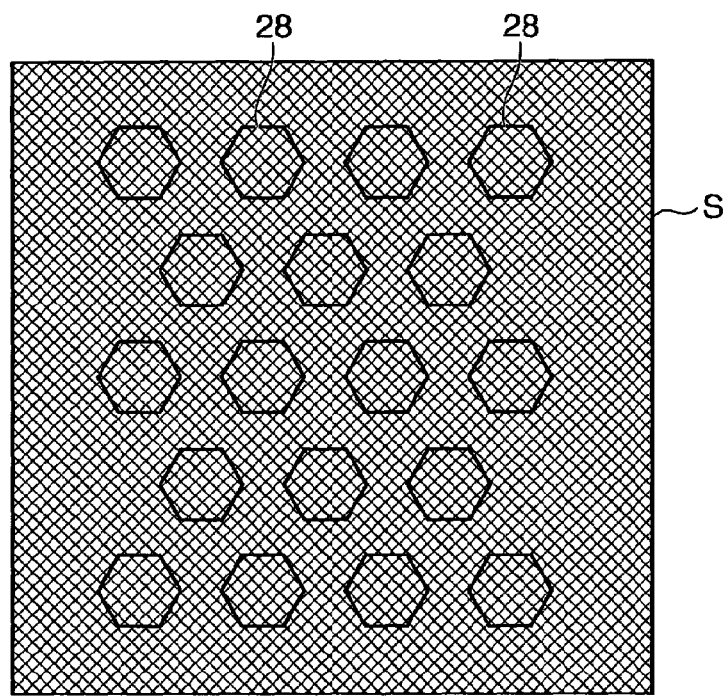
FIGS. 3A and 3B are process diagrams showing a method for manufacturing graphene according to a first embodiment of the present disclosure.
Figure 3B:
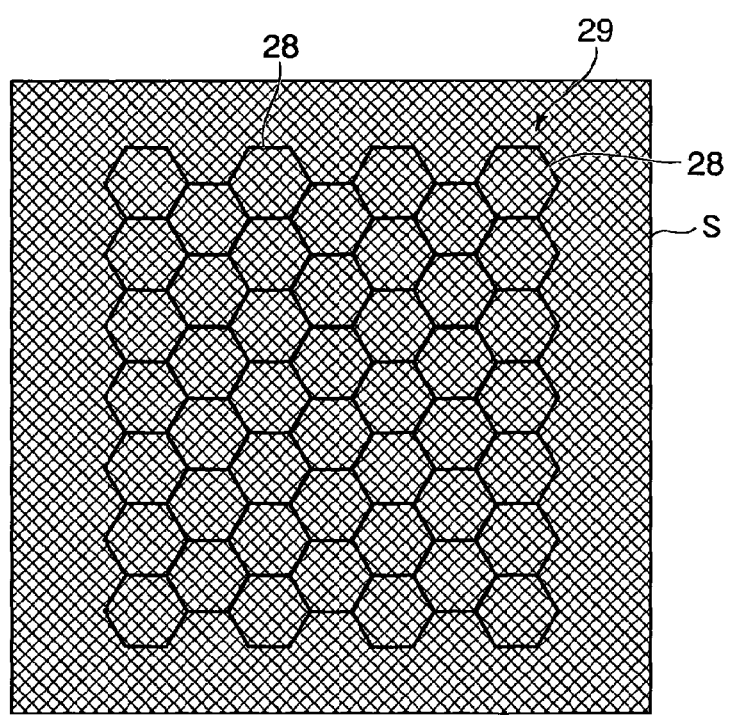
Figure 4A:
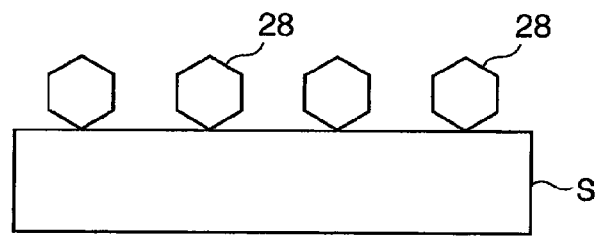
FIGS. 4A to 4C are process diagrams showing a method for manufacturing graphene according to a first embodiment of the present disclosure.
Figure 4B:
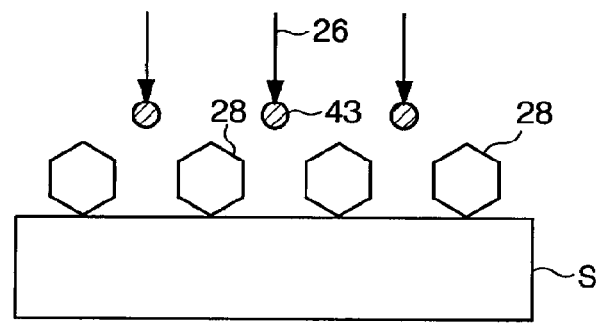
Figure 4C:
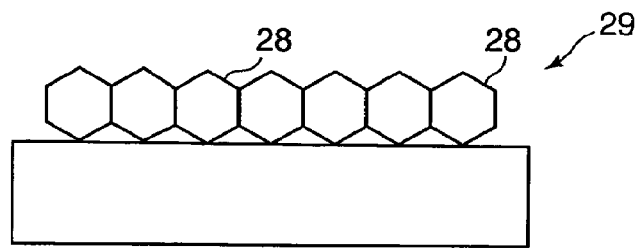

FIGS. 3A, 3B and 4A to 4C are process diagrams showing a method for manufacturing graphene according to the present embodiment. FIGS. 3A and 3B show a case where the substrate shown in FIG. 1 is viewed from above. FIGS. 4A to 4C show a case where the substrate shown in FIG. 1 is viewed from the side. In FIGS. 4A to 4C, in order to facilitate understanding, the six-membered ring structures 28 horizontally adsorbed to the surface of the substrate S are depicted so as to be perpendicular to the surface of the substrate S.

First, in the apparatus for manufacturing graphene 10, when the adsorption gas is supplied from the third gas supply device 17 to the substrate S, each of the six-membered ring structures 28 in each of the molecules of the adsorption gas is horizontally adsorbed to the surface of the substrate S (adsorption step). Since each of the six-membered ring structures 28 has directionality, if the surface of the substrate S is made of any one of crystal materials such as sapphire, artificial quartz, SiC, GaN, AlN, ZnO, BN, $MoS_2$, $WS_2$, $MoSe_2$, $WSe_2$, Ni, Co, Cu, W, Mo and the like, which have periodicity, for example, two-dimensional periodicity, the respective six-membered ring structures 28 are disposed so as to be spaced apart two-dimensionally periodically, for example, at regular intervals, in conformity with the two-dimensional periodicity of the surface of the substrate S (FIGS. 3A and 4A).

Next, a hydrocarbon gas is supplied from the first gas supply device 15 to the interior of the ionization auxiliary chamber 13, and a gas of acetylene 24 is supplied from the second gas supply device 16 to the space 23. At this time, when the ion beam 22 of the hydrocarbon cations 20 generated from the hydrocarbon gas passes through the space 23, a molecular beam 26 of the hydrocarbon molecules 43 is formed by charge conversion. The molecular beam 26 is irradiated on the substrate S (irradiation step) (FIG. 4B).

The molecular beam 26 irradiated on the substrate S imparts kinetic energy to each of the six-membered ring structures 28. Since the bonding energy of the six-membered ring structures 28 is 53 eV and the energy of the molecular beam 26 is also 50 eV to 100 eV, it is possible to easily open each of the six-membered ring structures 28. In addition, at this time, the carbon atoms of each of the hydrocarbon molecules 43 of the molecular beam 26 crosslink the respective six-membered ring structures 28 opened as above. Thus, a continuous structure (aggregate) of the six-membered ring structures 28 is formed on the surface of the substrate S, whereby one layer of graphene 29 can be manufactured (FIGS. 3B and 4C).

According to the present embodiment, a plurality of six-membered ring structures 28 is adsorbed on the surface of the substrate S. Furthermore, a molecular beam 26 of hydrocarbon molecules 43 is irradiated on the surface of the substrate S. Since the energy of the molecular beam 26 can be easily and accurately controlled, the distribution of the kinetic energy imparted to the respective adsorbed six-membered ring structures 28 does not extend over a wide range. Thus, it is possible to prevent generation of diamond or DLC from the six-membered ring structures 28 and to prevent carbon atoms decomposed from the opened six-membered ring structures 28 from becoming amorphous. Since a plurality of six-membered ring structures 28 is adsorbed on the surface of the substrate S, there is no need to bond a plurality of carbon atoms to form the six-membered ring structures 28 from one carbon atom. This makes it possible to prevent incomplete six-membered ring structures from being newly formed. As a result, it is possible to obtain a defect-free continuous structure of the six-membered ring structures 28, thereby making it possible to manufacture high-quality graphene 29 on the surface of the substrate S.

According to the present embodiment, the ring opening of the respective six-membered ring structures 28 is performed by the kinetic energy imparted by the molecular beam 26, while the crosslinking of the respective six-membered ring structures 28 is performed by the hydrocarbon atoms of the hydrocarbon molecules 43 forming the molecular beam 26. That is, since the ring opening and the crosslinking of the respective six-membered ring structures 28 can be performed by merely irradiating the molecular beam 26, there is no need to perform the ring opening and the crosslinking of the respective six-membered ring structures 28 in separate steps. This makes it possible to improve the throughput.

In the present embodiment, since the surface of the substrate S has two-dimensional periodicity, each of the six-membered ring structures 28 on the surface of the substrate S is two-dimensionally periodically arranged in conformity with the two-dimensional periodicity of the surface of the substrate S. As a result, it is possible to easily obtain a continuous structure of the six-membered ring structures 28 by merely crosslinking the respective six-membered ring structures 28.

Furthermore, in the present embodiment, since the ring opening of the respective six-membered ring structures 28 is performed by the kinetic energy imparted by the molecular beam 26 as described above, a great deal of heat energy is not required for cross-linking the respective six-membered ring structures 28. Therefore, when manufacturing the graphene 29, there is no need to heat the substrate S to a high temperature. For example, even if the substrate S is at a room temperature, it is possible to crosslink the respective six-membered ring structures 28. As a result, it is possible to reliably prevent destruction of elements of an electronic device formed on the substrate S. In addition, since the hydrocarbon molecules 43 forming the molecular beam 26 are electrically neutral, the substrate S to be irradiated with the molecular beam 26 is not charged. As a result, an insulating material may be selected as a material of which the substrate S is made. In addition, it is possible to omit a charge elimination process with respect to the substrate S and to further improve the throughput.

In the present embodiment, it is preferable that the hydrocarbon cations 20 are cations of acetylene or ethylene. In this case, the hydrocarbon molecules 43 forming the molecular beam 26 contain a carbon atom triple bond or a carbon atom double bond and become easily familiar with the six-membered ring structures 28 containing a carbon atom multiple bond. Therefore, the respective ring-opened six-membered ring structures 28 can be easily cross-linked with carbon atoms. Accordingly, it is possible to easily manufacture the graphene 29. In the present embodiment, there is a possibility that the hydrocarbon molecules 43 after charge conversion may collide with other hydrocarbon molecules 43 in the space 23 and may lose the kinetic energy thereof. Therefore, it is preferable that the interior of the accommodating chamber 11, particularly the space extending from the space 23 to the substrate S, is kept at a high vacuum. This makes it possible to prevent collisions between the hydrocarbon molecules 43 after charge conversion.

In the present embodiment, the gas of acetylene 24 as the charge conversion gas is supplied to the space 23. Alternatively, an ethylene gas may be supplied to the space 23.

In the present embodiment, in order to two-dimensionally and periodically arrange each of the six-membered ring structures 28, the substrate S is made of a material having two-dimensional periodicity on its surface. Alternatively, the substrate S may be made of a material having one-dimensional periodicity on its surface, for example, a material having a periodic step structure (a step of a single atomic layer). In this case, each of the six-membered ring structures 28 migrates to a step on the surface of the substrate S and is one-dimensionally periodically arranged along the step. By doing so, it is possible to easily obtain a continuous structure of the six-membered ring structures 28 by merely crosslinking the respective six-membered ring structures 28. The material having a periodic step structure may be relatively easily produced by, for example, subjecting silicon carbide to heat treatment at 900 to 1,000 degrees C.

Figure 5A:
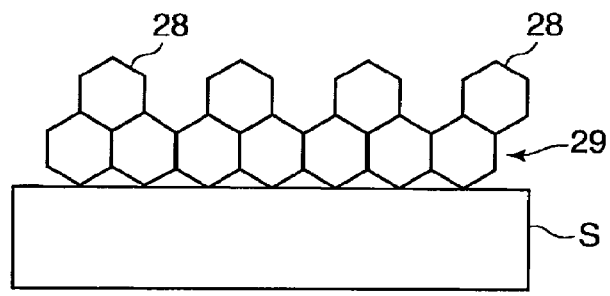
FIGS. 5A to 5C are process diagrams showing a method for manufacturing multiple layers of graphene.
Figure 5B:
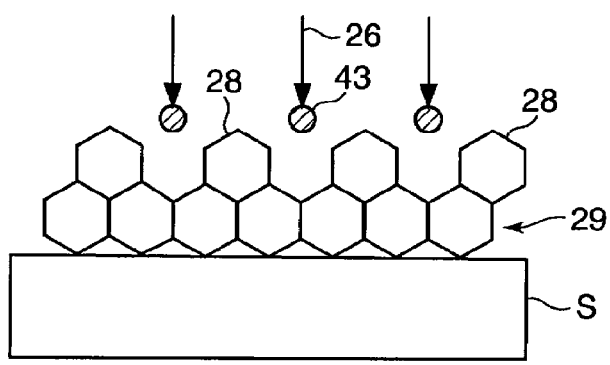
Figure 5C:
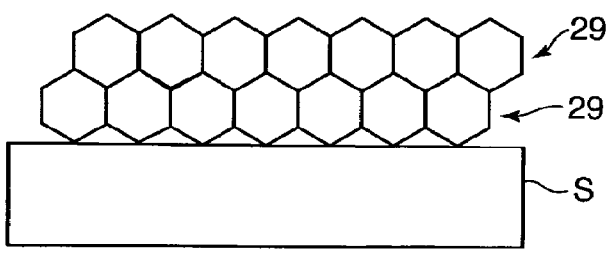

In the present embodiment, one layer of graphene 29 is manufactured by performing the adsorption of each of the six-membered ring structures 28 to the surface of the substrate S and the irradiation of the molecular beam 26 on the substrate S. However, as shown in FIGS. 5A to 5C, after one layer of graphene 29 is manufactured, a plurality of new six-membered ring structures 28 may be adsorbed to the surface of one layer of graphene 29 by again supplying the adsorption gas to the substrate S (FIG. 5A). Furthermore, the molecular beam 26 of the hydrocarbon molecules 43 may be irradiated toward the substrate S to crosslink the respective six-membered ring structures 28 (FIG. 5B). Thus, another one layer of graphene 29 may be manufactured (FIG. 5C). As a result, two layers of graphene 29 can be easily manufactured. Since the surface of the graphene 29 has two-dimensional periodicity, new six-membered ring structures 28 are two-dimensionally periodically arranged on the surface of the graphene 29. As a result, it is possible to easily obtain a continuous structure of the six-membered ring structures 28. In the case of manufacturing three or more layers of graphene 29, the supply of the adsorption gas toward the substrate S and the irradiation of the molecular beam 26 of the hydrocarbon molecules 43 on the substrate S may be repeated as many times as the number of layers of graphene.

In the present embodiment, the graphene 29 is manufactured over the entire surface of the substrate S. Alternatively, it is also possible to manufacture the graphene 29 on a part of the surface of the substrate S.

Figure 6:
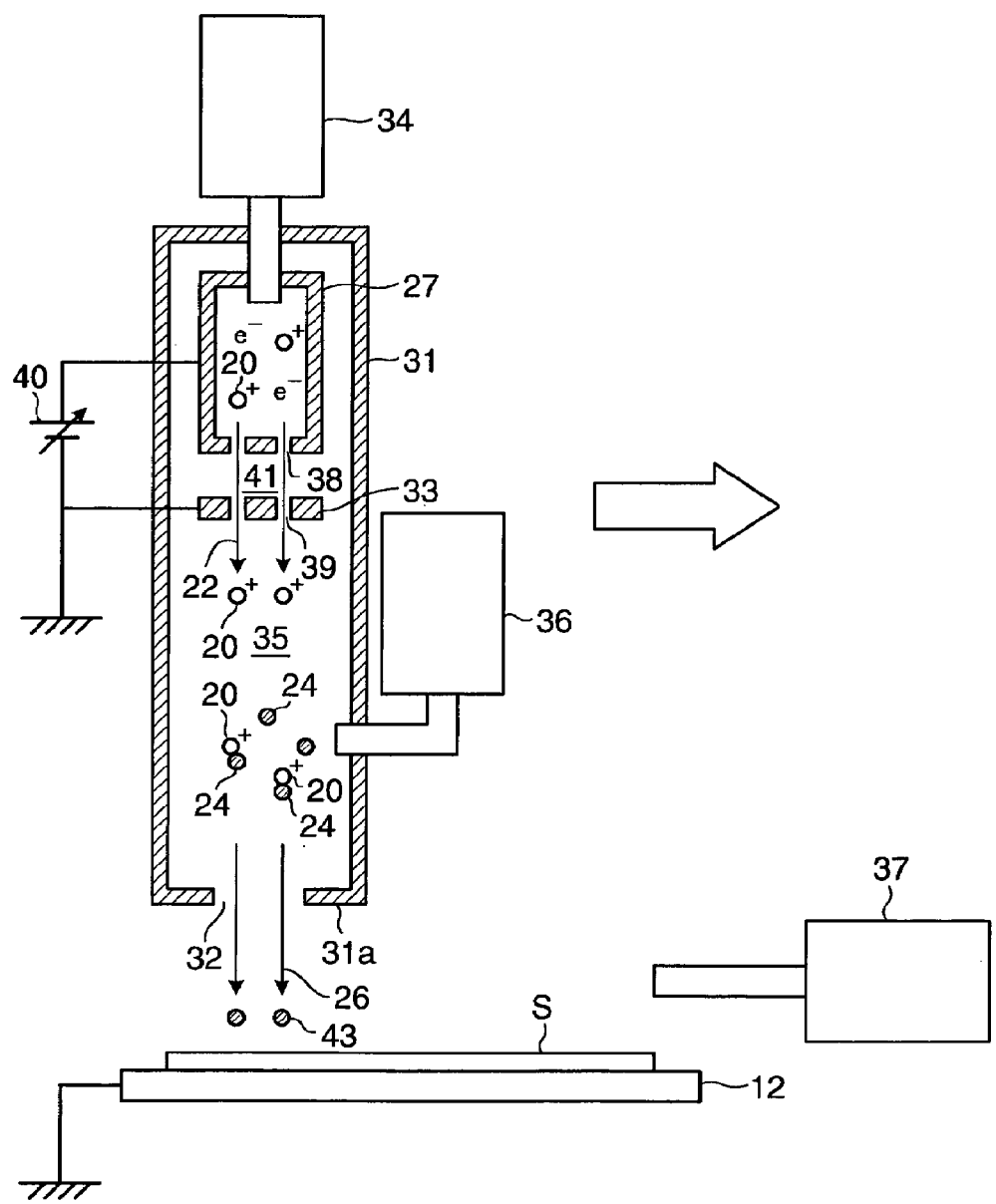
FIG. 6 is a sectional view schematically showing a configuration of a modification of the apparatus for manufacturing graphene according to the first embodiment of the present disclosure.

FIG. 6 is a sectional view schematically showing a configuration of a modification of the apparatus for manufacturing graphene according to the present embodiment.

In FIG. 6, the apparatus for manufacturing graphene 30 includes a cylindrical beam generation chamber 31. The beam generation chamber 31 is arranged so that a lower end 31a thereof faces a substrate S held by a stage 12. A beam irradiation hole 32 is opened at the lower end 31a. Further, the beam generation chamber 31 is configured to be movable along the surface of the substrate S (see the arrow in the figure) with the lower end 31a facing the substrate S.

The apparatus for manufacturing graphene 30 further includes an ionization auxiliary chamber 27 disposed on the inner upper side of the beam generation chamber 31 and a grounding plate 33 disposed between the ionization auxiliary chamber 27 and the beam irradiation hole 32 and configured to face the ionization auxiliary chamber 27.

The apparatus for manufacturing graphene 30 further includes a first gas supply device 34 configured to supply an ion generation gas to the interior of the ionization auxiliary chamber 27, and a second gas supply device 36 configured to supply a charge conversion gas into a space 35 between the grounding plate 33 and the beam irradiation hole 32. In this modification, a third gas supply device 37 configured to supply an adsorption gas toward the surface of the substrate S held by the stage 12 is arranged separately from the apparatus for manufacturing graphene 30.

The ionization auxiliary chamber 27 takes the form of a casing and ionizes the ion generation gas supplied to the interior thereof. The ionization auxiliary chamber 27 has a plurality of ion passage holes 38 opened on a surface facing the grounding plate 33. The grounding plate 33 has a plurality of ion ejection holes 39 penetrating the grounding plate 33 in the thickness direction. Each of the ion ejection holes 39 is arranged on the same straight line as each of the ion passage holes 38.

In the apparatus for manufacturing graphene 30, the grounding plate 33 and the stage 12 are electrically grounded. A positive potential of a predetermined potential is applied to the ionization auxiliary chamber 27 by a DC power supply 40. An electrostatic field 41 is formed between the ionization auxiliary chamber 27 and the grounding plate 33. Furthermore, when a hydrocarbon gas as the ion generation gas is supplied into the ionization auxiliary chamber 27, plasma is generated. The plasma contains electrons, hydrocarbon radicals and hydrocarbon cations 20.

In the apparatus for manufacturing graphene 30, the space potential sharply decreases from the ionization auxiliary chamber 27 toward the grounding plate 33 in the electrostatic field 41. Therefore, the hydrocarbon cations 20 leaking from each of the ion passage holes 38 of the ionization auxiliary chamber 27 to the electrostatic field 41 are accelerated toward the grounding plate 33. The accelerated hydrocarbon cations 20 are ejected into the space 35 via the ion ejection holes 39. Each of the hydrocarbon cations 20 ejected into the space 35 forms an ion beam 22.

When the ion beam 22 passes through the space 35, each of the hydrocarbon cations 20 collides with acetylene 24 of the charge conversion gas. At this time, each of the hydrocarbon molecules 43 generated by removing positive charges from each of the hydrocarbon cations 20 by charge conversion forms a molecular beam 26. The molecular beam 26 passes through the beam irradiation hole 32 and moves toward the substrate S held by the stage 12. That is, the molecular beam 26 is irradiated toward the substrate S from the apparatus for manufacturing graphene 30. Since the opening area of the beam irradiation hole 32 is smaller than the surface area of the substrate S, the molecular beam 26 is partially irradiated toward the surface of the substrate S. As a result, the graphene 29 is partially manufactured on the surface of the substrate S even if the third gas supply device 37 supplies a gas of molecules containing six-membered ring structures toward the surface of the substrate S. As described above, since the beam generation chamber 31 is configured to be movable along the surface of the substrate S, by moving the beam generation chamber 31, it is possible to manufacture graphene 29 over a desired area on the surface of the substrate S.

Next, a second embodiment of the present disclosure will be described.

Figure 7:
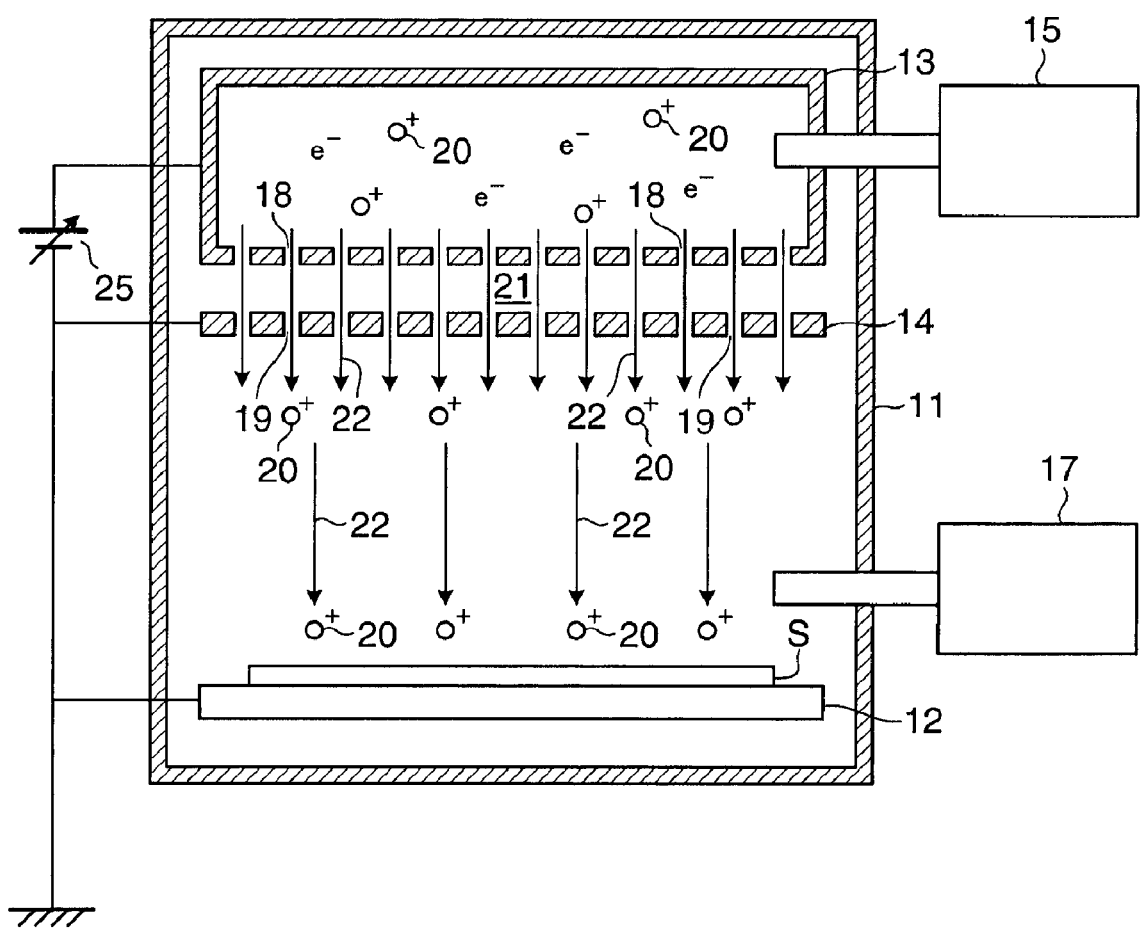
FIG. 7 is a sectional view schematically showing a configuration of an apparatus for manufacturing graphene according to a second embodiment of the present disclosure.

FIG. 7 is a sectional view schematically showing a configuration of an apparatus for manufacturing graphene according to the present embodiment.

Since the configuration and operation of the present embodiment are basically the same as those of the above-described first embodiment, descriptions of duplicate configurations and operations will be omitted. Different configurations and operations will be described below.

Referring to FIG. 7, an apparatus for manufacturing graphene 42 is different from the apparatus for manufacturing graphene 10 in that it does not include the second gas supply device 16. Similar to the apparatus for manufacturing graphene 10, the hydrocarbon cations 20 accelerated by the electrostatic field 21 are ejected into the space 23. Each of the hydrocarbon cations 20 ejected into the space 23 forms an ion beam 22. At this time, since no acetylene 24 is present in the space 23, each of the hydrocarbon cations 20 is directed to the substrate S without going through charge conversion. Therefore, in the present embodiment, the ion beam 22 instead of the molecular beam 26 is irradiated toward the substrate S. In the present embodiment, it is preferable that the hydrocarbon gas supplied into the ionization auxiliary chamber 13 by the first gas supply device 15 is a molecule gas containing a carbon atom double bond or a carbon atom triple bond, for example, a gas of acetylene gas or a gas of ethylene.

In the apparatus for manufacturing graphene 42, first, when an adsorption gas is supplied from the third gas supply device 17 to the substrate S, each of the six-membered ring structures 28 in each of molecules of the adsorption gas is adsorbed to the surface of the substrate S. Subsequently, when a hydrocarbon gas is supplied from the first gas supply device 15 into the ionization auxiliary chamber 13, an ion beam 22 of the hydrocarbon cations 20 generated from the hydrocarbon gas is formed. The ion beam 22 is irradiated on the substrate S.

The ion beam 22 irradiated on the substrate S imparts kinetic energy to each of the six-membered ring structures 28 to open the ring of each of the six-membered ring structures 28. At this time, the respective six-membered ring structures 28 in which the rings of the carbon atoms contained in each of the hydrocarbon cations 20 of the ion beam 22 are opened are cross-linked. Thus, a continuous structure of the six-membered ring structures 28 is formed on the surface of the substrate S, whereby one layer of graphene 29 can be manufactured.

According to the present embodiment, a plurality of six-membered ring structures 28 is adsorbed to the surface of the substrate S. Furthermore, the ion beam 22 of the hydrocarbon cations 20 is irradiated on the surface of the substrate S. Since the energy of the ion beam 22 can be easily and accurately controlled, it is possible to prevent generation of diamond or DLC from the six-membered ring structures 28 and to prevent carbon atoms decomposed from the opened six-membered ring structures 28 from becoming amorphous. Furthermore, there is no need to form the six-membered ring structures 28 from one carbon atom. This makes it possible to prevent incomplete six-membered ring structures from being newly formed. As a result, it is possible to obtain a defect-free continuous structure of the six-membered ring structures 28, thereby making it possible to manufacture high-quality graphene 29 on the surface of the substrate S.

In the present embodiment, the substrate S is irradiated with the charged ion beam 22. However, since the substrate S is grounded via the stage 12, the substrate S is not charged. In addition, since the apparatus for manufacturing graphene 42 does not include the second gas supply device 16, it is possible to reduce the manufacturing cost as compared with the apparatus for manufacturing graphene 10.

Although the present disclosure has been described with reference to the respective embodiments, the present disclosure is not limited to the above-described embodiments.

In each of the above-described embodiments, the third gas supply device 17 supplies the gas of a molecule containing six-membered ring structures as the adsorption gas toward the surface of the substrate S. However, when the surface of the substrate S has one-dimensional periodicity or two-dimensional periodicity, the adsorption gas is not limited to the gas of a molecule containing six-membered ring structures and may be, for example, a gas of a molecule including a linear structure of carbon atoms. In this case, the carbon atoms decomposed from the linear structure are one-dimensionally periodically or two-dimensionally periodically arranged in conformity with the periodicity of the surface of the substrate. When kinetic energy is imparted to each of the carbon atoms arranged one-dimensionally periodically or two-dimensionally periodically by the molecular beam 26 or the ion beam 22, the respective carbon atoms are easily cross-linked to form a six-membered ring structure. In addition, the respective six-membered ring structures thus formed are opened by the kinetic energy imparted by the molecular beam 26 or the ion beam 22 and are further cross-linked. Therefore, a continuous six-membered ring structure can be easily obtained.

Since the carbon atom double bond or the carbon atom triple bond is similar in structure to a part of the six-membered ring structure containing a carbon atom multiple bond, a six-membered ring structure can be relatively easily formed from a molecule containing the carbon atom double bond or the carbon atom triple bond. Therefore, it is preferable that the gas of a molecule containing a linear structure of carbon atoms as the adsorption gas is a gas of a molecule containing a carbon atom double bond or a carbon atom triple bond, for example, a gas of acetylene or a gas of ethylene.

Some of the benefits mentioned in the present disclosure may also be achieved by supplying a storage medium storing software program codes for realizing the functions of each of the above-described embodiments to a controller (not shown) provided in the apparatus for manufacturing graphene 10 (hereinafter simply referred to as "controller"), and reading and executing the program codes stored in the storage medium with a CPU of the controller.

In this case, the program codes read from the storage medium realizes the functions of each of the above-described embodiments. The program codes and the storage medium storing the program codes constitute the present disclosure.

The storage medium for supplying the program codes may be any storage medium capable of storing the program codes such as, for example, a RAM, an NV-RAM, a floppy (registered trademark) disk, a hard disk, a magneto-optical disk, an optical disk such as a CD-ROM, a CD-R, a CD-RW, a DVD (a DVD-ROM, a DVD-RAM, a DVD-RW or a DVD+RW), a magnetic tape, a nonvolatile memory card, other ROMs, and the like. Alternatively, the program codes may be supplied to the controller by downloading them from another computer (not shown), a database or the like connected to the Internet, a commercial network, a local area network, or the like.

Further, by executing the program codes read by the controller, not only the functions of each of the above-described embodiments are realized, but also a part or the entirety of the actual processing is performed by an OS (operating system) or the like operating on the CPU based on the instructions of the program codes. The functions of each of the above-described embodiments are realized by the processing.

Furthermore, after the program codes read from the storage medium are written in the memory provided in a function expansion board inserted into the controller or a function expansion unit connected to the controller, a CPU or the like provided in the function expansion board or the function expansion unit performs a part or the entirety of the actual processing based on the instructions of the program codes. The functions of each of the above-described embodiments are realized by the processing.

The form of the program codes may be in the form of object codes, program codes executed by an interpreter, script data supplied to an OS, or the like.

This application claims priority based on Japanese Patent Application No. 2015-173086 filed on Sep. 2, 2015, the entire contents of which are incorporated herein by reference.

According to the present disclosure, the six-membered ring structures of carbon atoms are adsorbed on the surface of the substrate, and the beam of a molecule containing carbon atoms is irradiated on the surface of the substrate. Since the energy of the beam is easy to control, the distribution of the energy imparted to the carbon atoms does not extend over a wide range. Thus, it is possible to prevent the generation of diamond or DLC from the carbon atoms and to prevent the carbon atoms from becoming amorphous. In addition, since the six-membered ring structures of carbon atoms are adsorbed on the surface of the substrate, there is no need to bond carbon atoms to form six-membered ring structures from one carbon atom. This makes it possible to prevent incomplete six-membered ring structures from being newly formed. As a result, it is possible to manufacture high-quality graphene.

Furthermore, according to the present disclosure, the linear structures of carbon atoms are adsorbed to the surface of the substrate, and the beam of a molecule containing carbon atoms is irradiated on the surface of the substrate. Since the energy of the beam is easy to control, the distribution of the energy imparted to the carbon atoms does not extend over a wide range. Thus, it is possible to prevent the generation of diamond or DLC from the carbon atoms and to prevent the carbon atoms from becoming amorphous. In addition, since the surface of the substrate has one-dimensional periodicity or two-dimensional periodicity, each of the six-membered ring structures formed from the carbon atoms is disposed one-dimensionally periodically or two-dimensionally periodically in conformity with the periodicity of the surface of the substrate. Thus, a continuous six-membered ring structure can be easily obtained by merely crosslinking the respective six-membered ring structures. As a result, it is possible to manufacture high-quality graphene.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing graphene, comprising:
an adsorption step of causing six-membered ring structures of carbon atoms to be adsorbed to a surface of a substrate; and
an irradiation step of irradiating the surface of the substrate to which the six-membered ring structures are adsorbed with a molecular beam containing carbon atoms, such that one layer of graphene is formed by:
ionizing molecules containing carbon atoms to form cations of the molecules;
accelerating the cations in an electrostatic field to form an ion beam;
causing the ion beam to pass through a space in which a charge conversion gas exists, such that electric charges of the cations are moved to molecules of the charge conversion gas and the electrically neutralized molecules containing carbon atoms form the molecular beam;

opening the six-membered ring structures adsorbed to the surface of the substrate by a kinetic energy imparted by the molecular beam; and crosslinking the opened six-membered ring structures by the carbon atoms contained in the molecular beam.

2. The method of claim 1, wherein the surface of the substrate has two-dimensional periodicity.

3. The method of claim 1, wherein energy of the molecular beam is 50 eV to 100 eV.

4. The method of claim 1, wherein the molecules of the charge conversion gas and the molecules containing carbon atoms are the same type of molecules.

5. The method of claim 1, wherein in the irradiating step, the molecules containing carbon atoms are ionized and accelerated in an electrostatic field.

6. The method of claim 1, wherein each of the molecules containing carbon atoms contains a carbon atom double bond or a carbon atom triple bond.

7. The method of claim 6, wherein the molecules containing carbon atoms are ethylene or acetylene.

8. The method of claim 2, wherein the substrate is made of a crystal material selected from a group consisting of sapphire, artificial quartz, SiC, GaN, AlN, ZnO, BN, $MoS_2$, $WS_2$, $MoSe_2$, $WSe_2$, Ni, Co, Cu, W and Mo.

9. The method of claim 1, wherein the adsorption step and the irradiation step are repeated.

* * * * *